US007132885B2

(12) United States Patent  
Capofreddi et al.

(10) Patent No.: US 7,132,885 B2  
(45) Date of Patent: Nov. 7, 2006

(54) LOW PHASE SHIFT IMPLEMENTATION OF THE BASEBAND CIRCUITRY OF A CARTESIAN FEEDBACK LOOP

(75) Inventors: Peter Capofreddi, San Francisco, CA (US); Derek K. Shaeffer, Redwood City, CA (US); Korhan Titizer, Saratoga, CA (US)

(73) Assignee: Aspendos Communications, San Jose, CA (US)

( * ) Notice: Subject to any disclaimer, the term of this patent is extended or adjusted under 35 U.S.C. 154(b) by 72 days.

(21) Appl. No.: 11/088,676

(22) Filed: Mar. 23, 2005

(65) Prior Publication Data

US 2006/0226901 A1   Oct. 12, 2006

(51) Int. Cl.
*H03F 1/36* (2006.01)
(52) U.S. Cl. ............... 330/107; 330/85; 330/124 R
(58) Field of Classification Search ........... 330/107, 330/85, 124 R, 295, 51, 53
See application file for complete search history.

(56) References Cited

U.S. PATENT DOCUMENTS

| 5,507,017 | A  | * | 4/1996  | Whitmarsh et al. | 455/126 |
| 5,880,633 | A  | * | 3/1999  | Leizerovich et al. | 330/84  |
| 6,233,438 | B1 | * | 5/2001  | Wynn | 455/126 |
| 6,381,286 | B1 | * | 4/2002  | Wilkinson et al. | 375/296 |
| 6,859,097 | B1 | * | 2/2005  | Chandler | 330/107 |
| 6,977,968 | B1 | * | 12/2005 | Lipp | 375/297 |

* cited by examiner

*Primary Examiner*—Patricia Nguyen
(74) *Attorney, Agent, or Firm*—Fish & Richardson P.C.

(57) ABSTRACT

A circuit is provided that includes a Cartesian feedback loop. The Cartesian feedback loop includes one or more operational amplifiers. At least one of the operational amplifiers includes two or more cascaded amplifier stages and one or more bypass amplifier stages. The bypass amplifier stages are connected in parallel with the cascaded amplifier stages.

13 Claims, 9 Drawing Sheets

LOW PHASE SHIFT IMPLEMENTATION OF THE BASEBAND CIRCUITRY OF A CARTESIAN FEEDBACK LOOP

TECHNICAL FIELD

The present invention relates to electronic circuits.

BACKGROUND

A well known method to improve the linearity of a radio frequency amplifier is to use a Cartesian feedback loop. Referring to FIG. 1, a conventional Cartesian feedback loop 100 is shown that includes a baseband section 102, an RF section 106, and a modulator 104. FIG. 1 shows a differential half circuit with each line representing a differential signal, which is actually carried on two wires. Cartesian feedback loop 100 further includes two feedback loops in the baseband section 102—an "I-loop" for an in-phase signal and a "Q-loop" for a quadrature signal.

Each feedback loop includes an input amplifier 108 to amplify an input signal I, Q. Each feedback loop further includes a signal combiner 110 that can combine the amplified input signal and a baseband feedback signal 109 to produce a combined forward-path signal 111. The combined forward-path signal 111 in each feedback loop can be amplified by a forward-path amplifier 112. Each feedback loop further includes a rotator 118 to compensate for the delay in the RF section and to keep the I-loop and the Q-loop uncoupled. Each feedback loop further includes a loop filter 114 to filter the combined forward-path signal. Each feedback loop further includes a feedforward mixer 116 to modulate the combined forward-path signal and produce an RF signal.

Cartesian feedback loop 100 further includes a feedback mixer 126 to demodulate the RF signal and produce a baseband feedback signal. Cartesian feeback loop 100 further includes a feedback baseband amplifier 128 to amplify the resulting baseband feedback signal.

A well known problem with a Cartesian feedback loop, such as the one shown in FIG. 1, is the presence of a phase shift in the baseband section due to parasitics associated with integrated circuit components. A large phase shift in a Cartesian feedback loop can result in peaking and/or oscillation.

SUMMARY

In general, in one aspect, a circuit is provided that includes a Cartesian feedback loop. The Cartesian feedback loop includes one or more operational amplifiers. At least one of the operational amplifiers includes two or more cascaded amplifier stages and one or more bypass amplifier stages. The bypass amplifier stages are connected in parallel with the cascaded amplifier stages.

Implementations of the invention can include one or more of the following features. The cascaded amplifier stages can include two cascaded amplifier stages. The bypass amplifier stages can include one bypass amplifier stage. The cascaded amplifier stages can be configured such that a gain roll-off of the respective operational amplifier is above 20 decibels per decade for a range of frequencies. The range of frequencies for which a gain roll-off of the respective operational amplifier is above 20 decibels per decade can include a crossover frequency of the Cartesian feedback loop.

The Cartesian feedback loop can include an I-loop and a Q-loop. The I-loop can carry an in-phase signal. The Q-loop can carry a quadrature signal. The Cartesian feedback loop can further include a phase rotator. The phase rotator can keep the I-loop and the Q-loop uncoupled. The cascaded amplifier stages and the bypass amplifier stages can be included in the phase rotator.

At least one of the cascaded amplifier stages or the bypass amplifier stages can include a common-source amplifier. At least one of the cascaded amplifier stages or the bypass amplifier stages can include a common source amplifier followed by common-gate amplifier.

The Cartesian feedback loop can include a forward-path amplifier in a forward path of the Cartesian feedback loop. The cascaded amplifier stages and the bypass amplifier stages can be included in the forward-path amplifier. The Cartesian feedback loop can include a feedback amplifier in a feedback path of the Cartesian feedback loop. The cascaded amplifier stages and the bypass amplifier stages can be included in the feedback amplifier.

The Cartesian feedback loop can include a loop filter to filter a signal in a forward path of the Cartesian feedback loop. The cascaded amplifier stages and the bypass amplifier stages can be included in the loop filter.

A current in at least one of the cascaded amplifier stages or the bypass amplifier stages can be recycled in another cascaded amplifier stage or another bypass amplifier stage.

Implementations of the invention can realize one or more of the following advantages. The phase shift of a Cartesian feedback loop can be reduced. Furthermore, stability of a Cartesian feedback loop can be improved.

The details of one or more implementations of the invention are set forth in the accompanying drawings and the description below. Other features, objects, and advantages of the invention will be apparent from the description and drawings, and from the claims.

DETAILED DESCRIPTION

Figure 2:
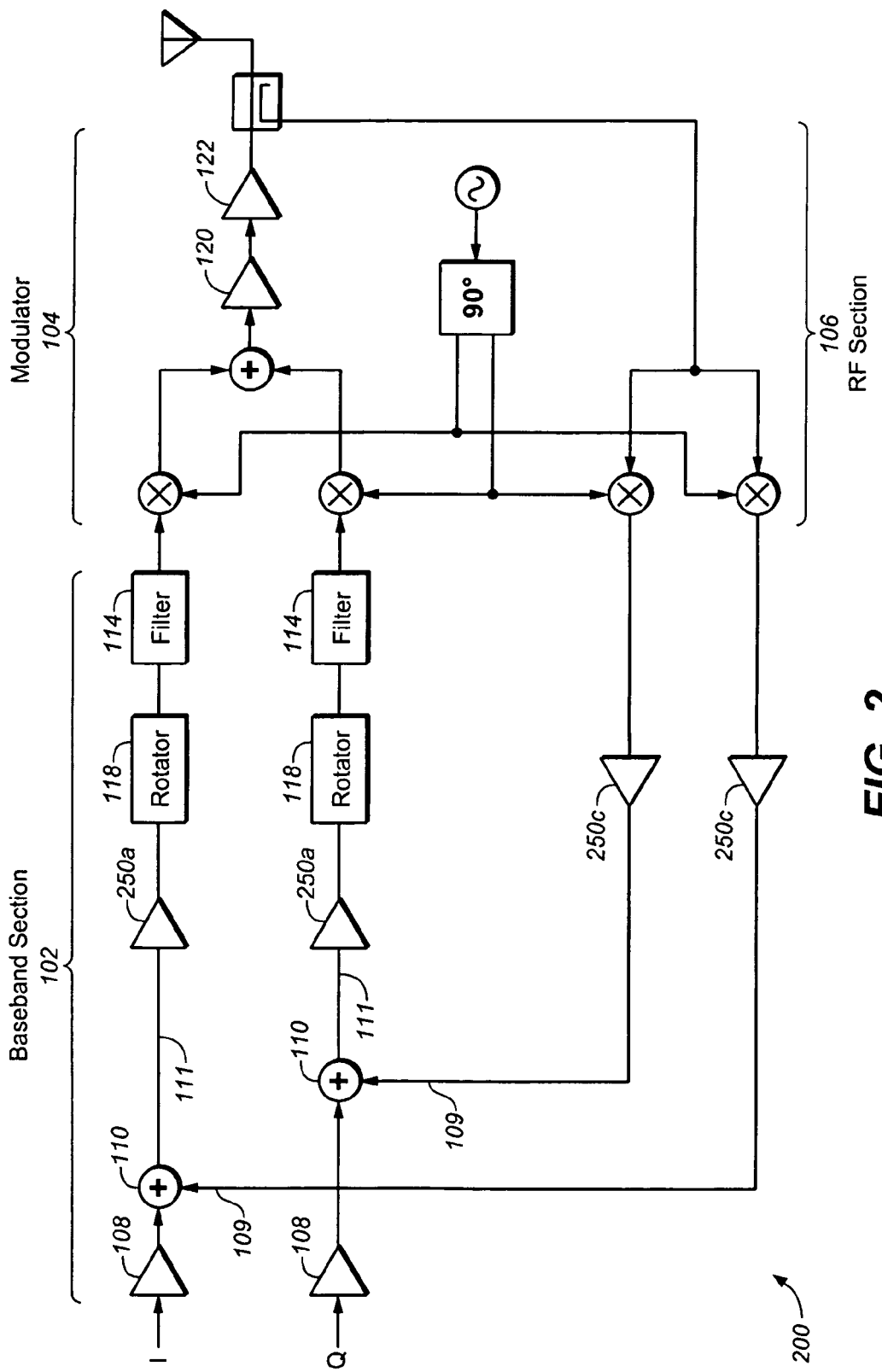
FIG. 2 shows the Cartesian feedback loop of FIG. 1 with multistage feedforward compensated operational amplifiers.

Referring to FIG. 2, the phase shift in a Cartesian feedback loop 200 can be reduced by using one or more multistage feedforward compensated operational amplifiers 250$a,c$ in the baseband section 202 of the Cartesian feedback loop 200. FIG. 2 shows a differential half circuit with each line representing a differential signal, which is actually carried on two wires. For example, as shown in FIG. 2, Cartesian feedback loop 200 can include a forward-path multistage feedforward compensated operational amplifier 250a and a feedback multistage feedforward compensated operational amplifier 250c.

Figure 3A:
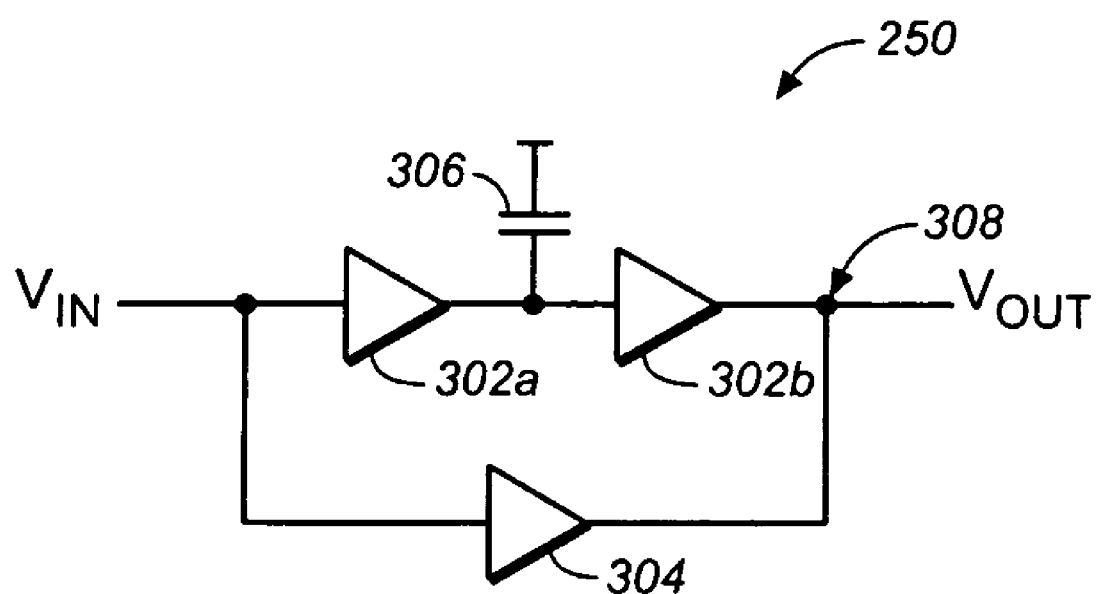
FIG. 3A shows one implementation of a multistage feedforward compensated operational amplifier.

Referring to FIG. 3A, a multistage feedforward compensated operational amplifier 250a,c can include two or more (e.g., two) cascaded amplifier stages 302a, 302b, and one or more (e.g., one) bypass stages 304. FIG. 3A shows a differential half circuit with each line representing a differential signal, which is actually carried on two wires. The cascaded amplifier stages 302a, 302b can be connected in parallel with the bypass stage(s) 304. A multistage feedforward compensated operational amplifier 250a,c can further include a compensation capacitor 306 to adjust the crossover frequency of the cascaded amplifier stages 302a, 302b. At the output junction 308, the output currents of the cascaded amplifier stages 302a, 302b and the bypass stage(s) 304 can be combined to produce an output signal.

Figure 3B:
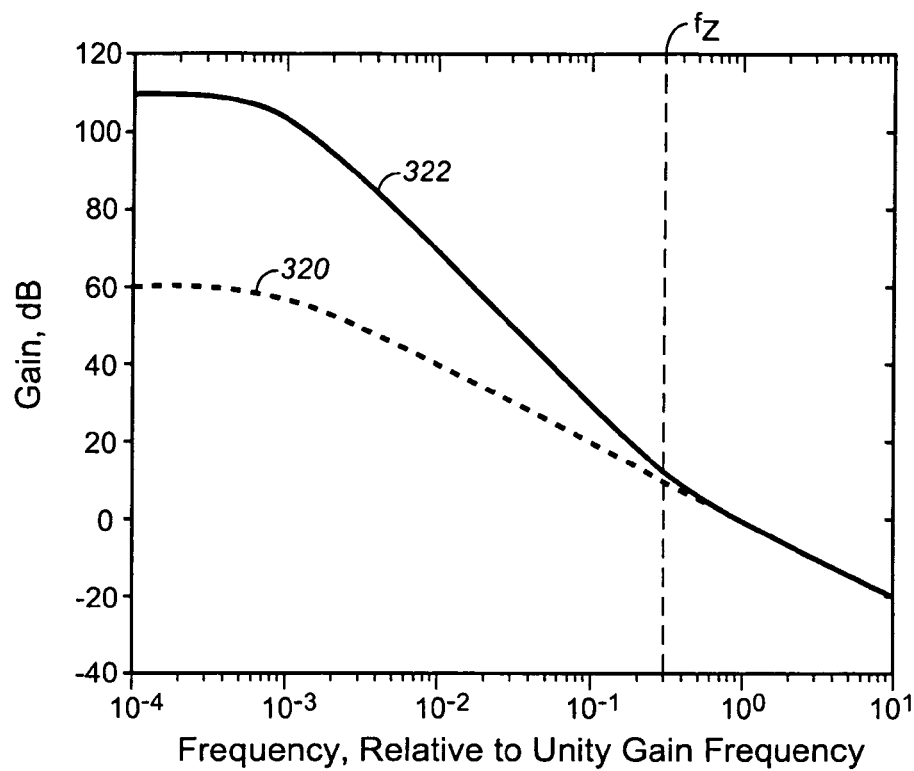
FIG. 3B shows a gain vs. frequency relationship of a conventional operational amplifier and a gain vs. frequency relationship of a multistage feedforward compensated operational amplifier.

Referring to FIG. 3B, the gain of a conventional operational amplifier rolls off from DC to the unity gain crossover frequency at a rate of approximately twenty decibels pre decade (as shown in plot 320). The gain plot 330 of a multistage operational amplifier with feedforward compensation (e.g., amplifier 250a,c) on the other hand, can roll off at a rate of forty decibels per decade or higher at lower frequencies, returning to approximately twenty decibels per decade at the unity gain crossover frequency (as shown in plot 322). A higher roll-off rate can result in a higher gain at frequencies below the zero frequency $f_z$. Accordingly, a multistage feedforward compensated operational amplifier (e.g, amplifier 250a,c), as compared to a conventional operational amplifier, can have a higher gain at frequencies below the zero frequency $f_z$.

The closed-loop phase shift of a feedback loop containing an operational amplifier is a function of the gain A(f) of the operational amplifier and the feedback network gain F(f). The gain A(f) of an operation amplifier and the feedback network gain F(f) are functions of frequency f. The closed-loop phase shift of a feedback loop containing an operational amplifier with a large gain A(f) is given (in degrees) approximately by $$\arg\{C(f)\} = \frac{180}{\pi} \frac{\sin[\arg\{A(f)F(f)\}]}{|A(f)F(f)|} - \arg\{F(f)\} \quad (1)$$

where arg{A(f)F(f)} denotes the phase angle of the complex product of A(f) and F(f), and |A(f)F(f)| denotes the magnitude of the complex product of A(f) and F(f). A salient feature of the relationship (1) above is that the phase shift arg{C(f)} of a feedback loop containing an operational amplifier decreases as the magnitude of the gain of the operational amplifier |(A)(f)| increases.

Figure 3C:
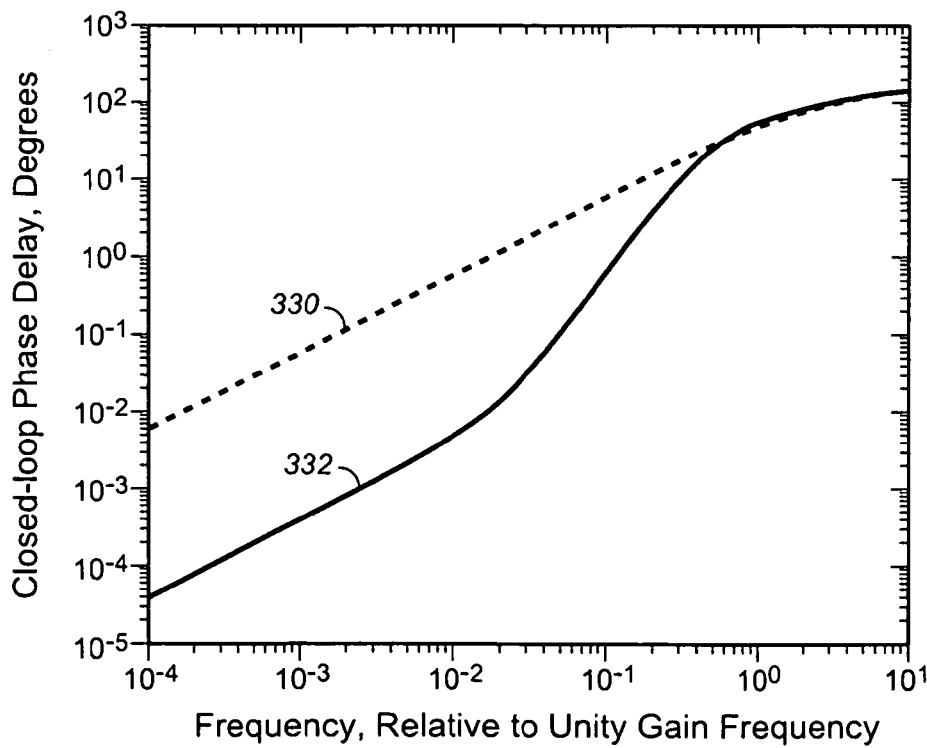
FIG. 3C shows a closed-loop phase shift vs. frequency relationship of a conventional operational amplifier and a closed-loop phase shift vs. frequency relationship of a multistage feedforward compensated operational amplifier.

Accordingly, referring to FIG. 3C, as compared to a conventional operational amplifier, a multistage feedforward compensated operational amplifier (e.g., amplifier 250a,c), in addition to having a higher open-loop gain, can have a smaller closed-loop phase shift. In particular, the closed-loop phase shift of a multistage feedforward compensated operational amplifier (as shown in plot 332) can be smaller than the closed-loop phase shift of a conventional operational amplifier (as shown in plot 330) for frequencies below the path crossover frequency $f_z$ of the operational amplifier.

Another salient feature of equation (1) is that in the region where the open-loop phase response lies between 90 and 180 degrees, 90<arg{A(f)F(f)}<180, the phase shift arg{C(f)} of a feedback loop containing an operational amplifier decreases as the open-loop phase response arg{A(f)F(f)} increases.

Figure 4A:
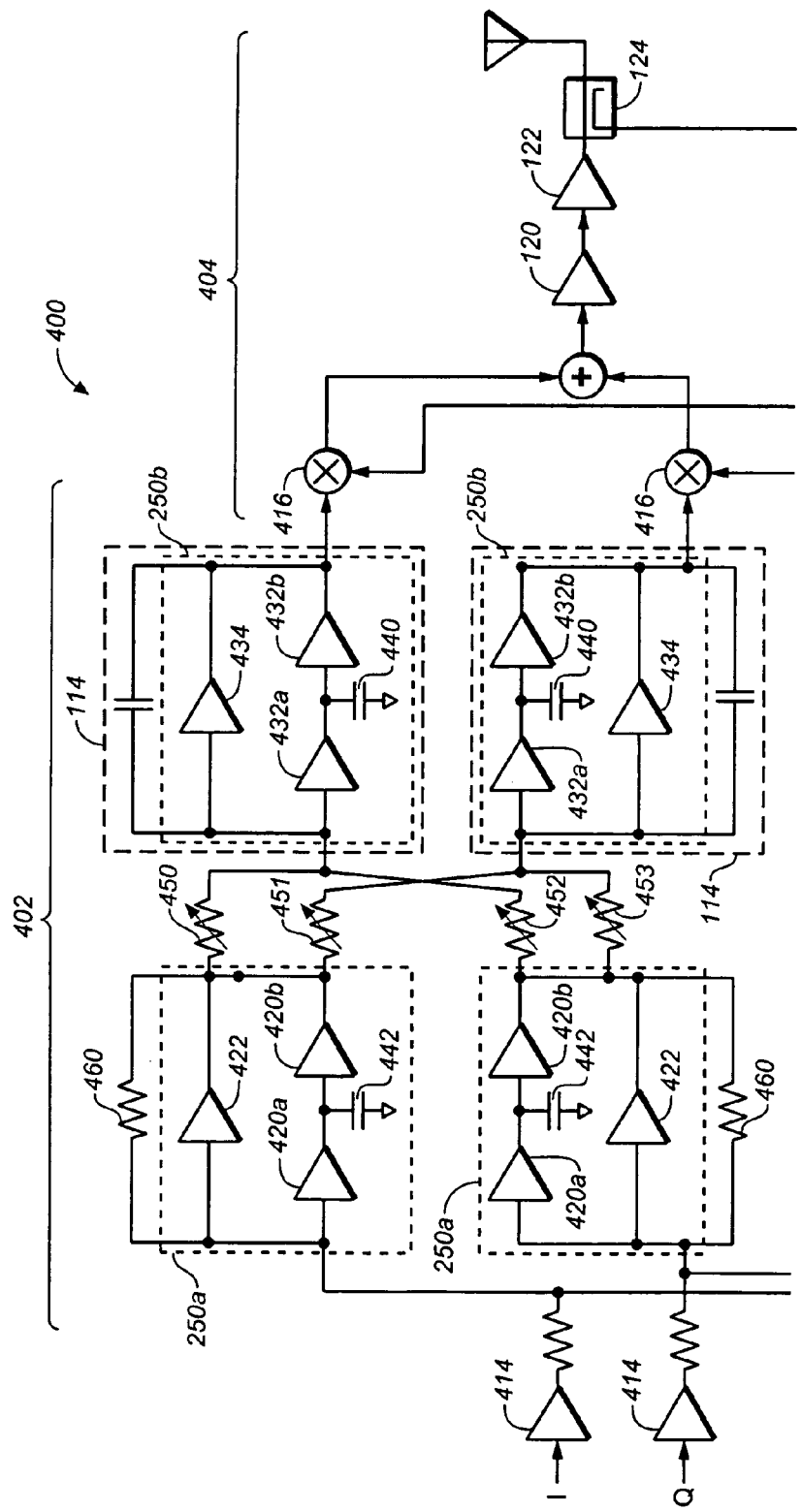
FIG. 4 shows a Cartesian feedback loop with multistage feedforward compensated operational amplifiers according to one implementation.
Figure 4B:
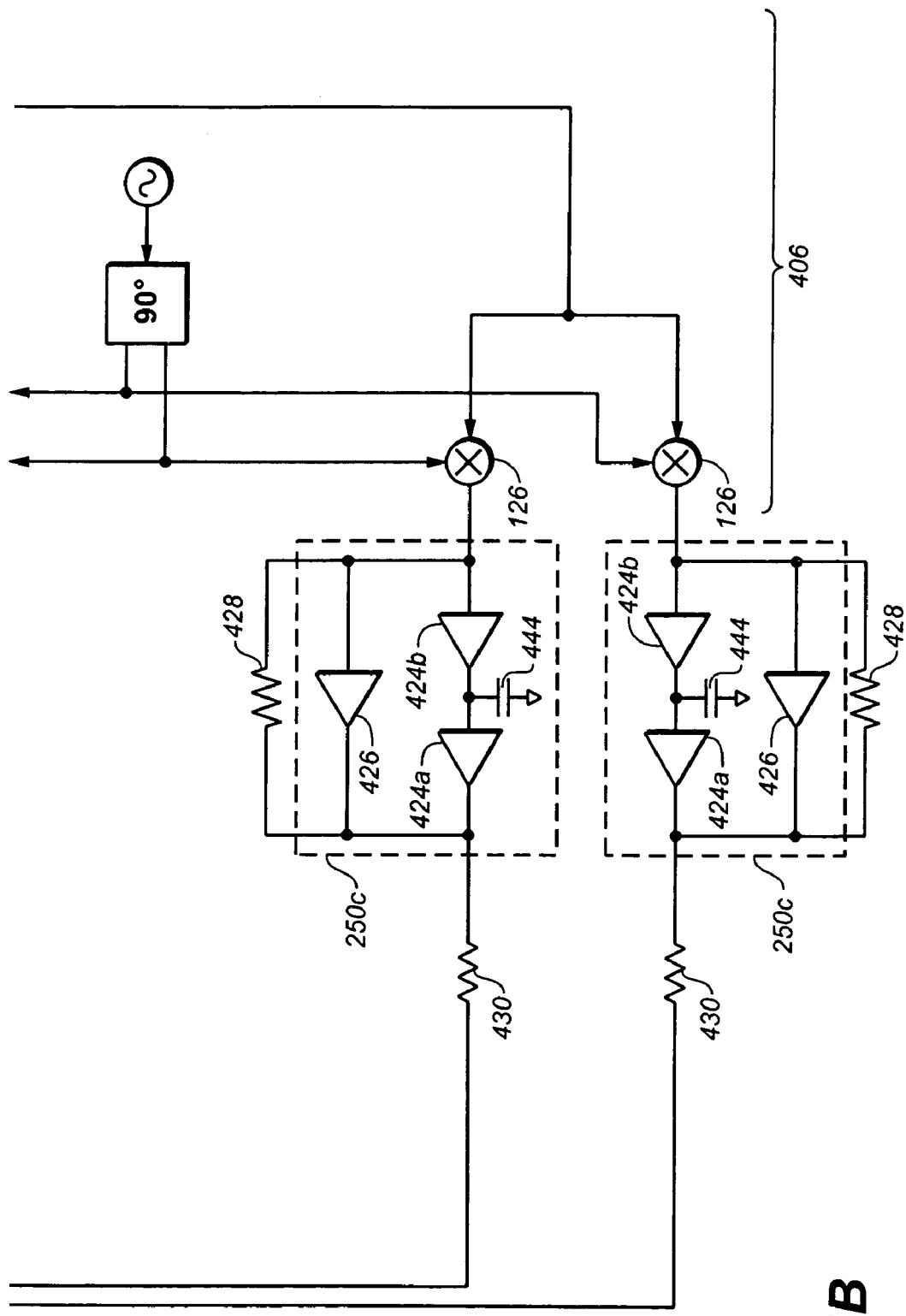

FIG. 4 shows one implementation of a Cartesian feedback loop 400 with multistage feedforward compensated operational amplifiers 250a–c. FIG. 4 shows a differential half circuit with each line representing a differential signal, which is actually carried on two wires. The Cartesian feedback loop 400 includes a baseband section 402, an RF section 406, and a modulator 404. The Cartesian feedback loop 400 can further include two feedback loops in the baseband section 402—an "I-loop" for an in-phase signal and a "Q-loop" for a quadrature signal. Each feedback loop can include an input amplifier 414 to amplify an input signal I, Q. Each feedback loop can further include a feedforward mixer 416 to modulate the signal in the forward path 408 of the respective feedback loop and produce an RF signal.

Each feedback loop can include one or more multistage feedforward compensated operational amplifiers 250a–c. For example, each feedback loop can include a forward-path multistage feedforward compensated operational amplifier 250a. A forward-path multistage feedforward compensated operational amplifier 250a can amplify the current in the forward path 408 of the respective feedback loop (often referred to as "error current") and perform a current-to-voltage conversion. A forward-path multistage feedforward compensated operational amplifier 250a can include two or more (e.g., two) cascaded amplifier stages 420a, 420b, and one or more (e.g., one) bypass stages 422. Additionally, each forward-path multistage feedforward compensated operational amplifier 250a can include a compensation capacitor 442 to adjust the crossover frequency of the cascaded amplifier stages 420a, 420b. Each forward-path multistage feedforward compensated operational amplifier 250a can further include a feedback network. In one implementation, a feedback network can include a resistor 460 that sets the transimpedance of the feedback loop (i.e., I-loop or Q-loop).

Figure 1:
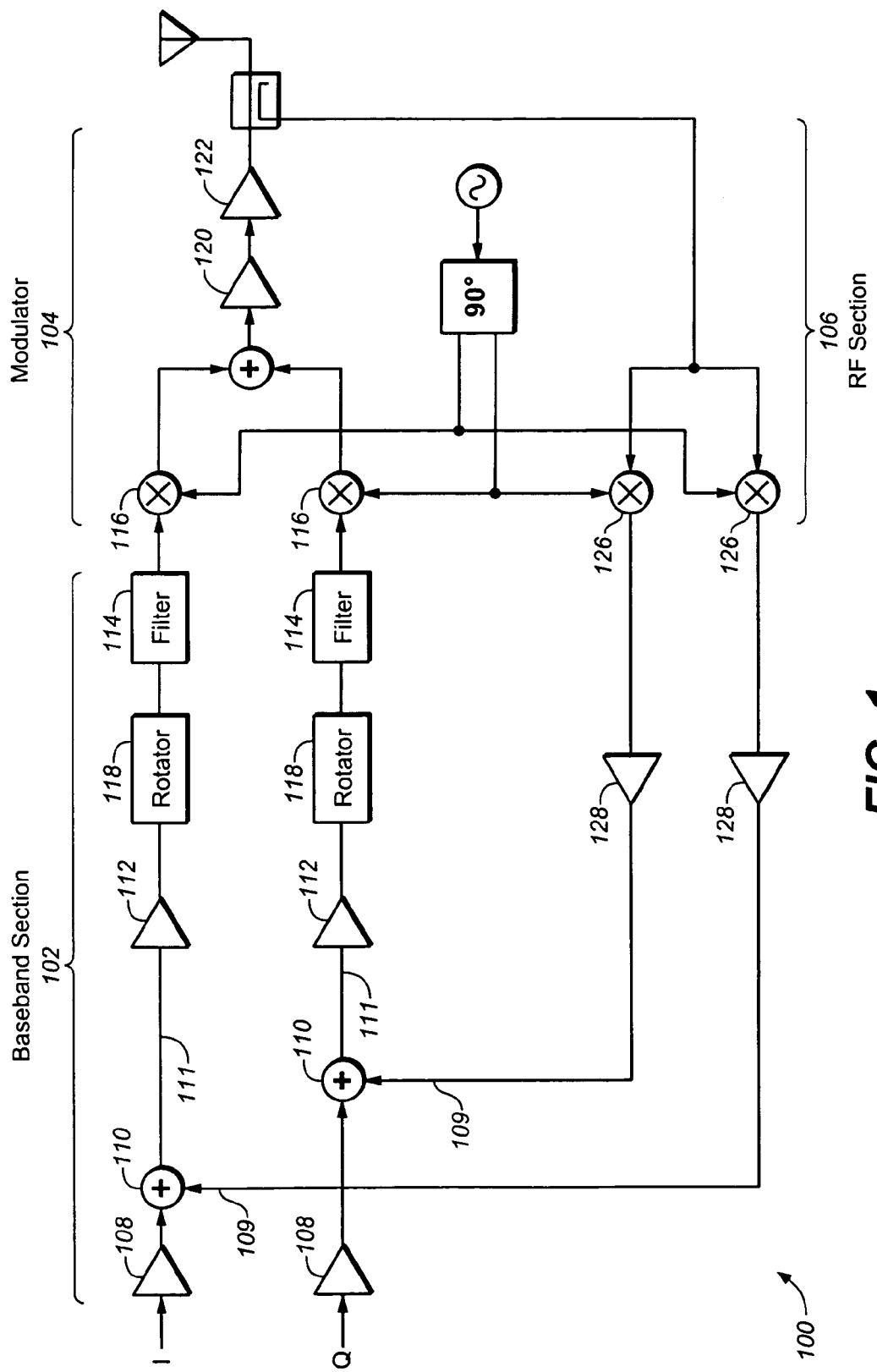
FIG. 1 shows a conventional Cartesian feedback loop.

The outputs of the forward-path multistage feedforward compensated operational amplifiers 250a can be coupled through variable resistors 450–453. The variable resistors 450–453 can perform the rotation function described in reference to FIG. 1 to separate the I-loop from the Q-loop. The variable resistors 450–453 can futher perform a voltage-to-current conversion.

Each feedback loop can further include a feedback multistage feedforward compensated operational amplifier 250c to amplify the output current from the feedforward mixer 416 and perform a current-to-voltage conversion. A feedback multistage feedforward compensated operational amplifier 250c can include two or more (e.g., two) cascaded amplifier stages 424a, 424b, and one or more (e.g., one) bypass stage 426. Additionally, each feedback multistage feedforward compensated amplifier 250c can include a compensation capacitor 444 to adjust the crossover frequency of the cascaded amplifier stages 424a, 424b. Each feedback multistage feedforward compensated operational amplifier 250c can further include a feedback network. In one implementation, a feedback network can include a resistor 428 that sets the transimpedance of the feedback loop (i.e., I-loop or Q-loop). Another resistor 430 connected to the output of the cascaded amplifier stages 424a, 424b and the bypass stage(s) 426 can perform voltage-to-current conversion. The resulting current can then be combined with a current from the amplified input signal I, Q to produce the current (i.e. "error current") in the forward path 408 of the respective feedback loop.

Each feedback loop can further include a loop filtering section 114 to filter the signal in the forward path 408 of the respective feedback loop to maintain stability in the Cartesian feedback loop 400. Each loop filtering section 114 can include a multistage feedforward compensated operational amplifier 250b to integrate the current in the forward path 408 of the respective feedback loop. Each multistage feedforward compensated operational amplifier 250b can include two or more (e.g., two) cascaded amplifier stages 432a, 432b, and one or more (e.g., one) bypass stage 434. Additionally, each multistage feedforward compensated operational amplifier 250b can include a compensation capacitor 440 to adjust the crossover frequency of the cascaded amplifier stages 432a, 432b.

Figure 5A:
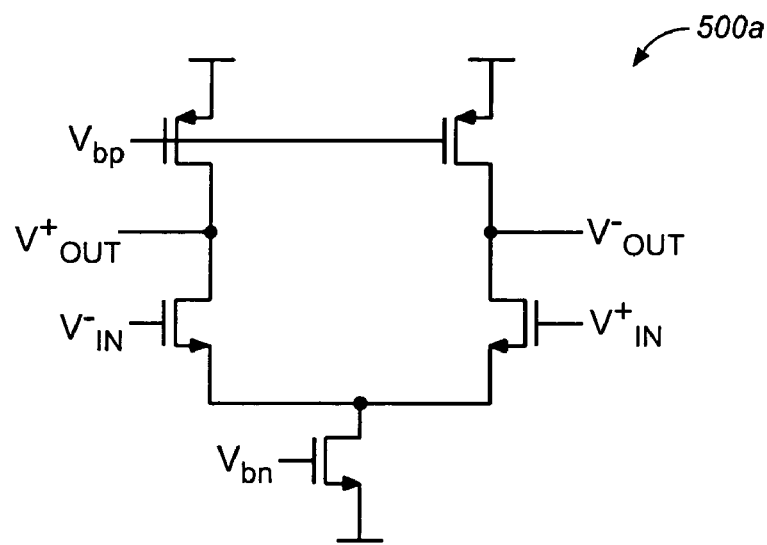
FIG. 5A shows a common-source amplifier.
Figure 5B:
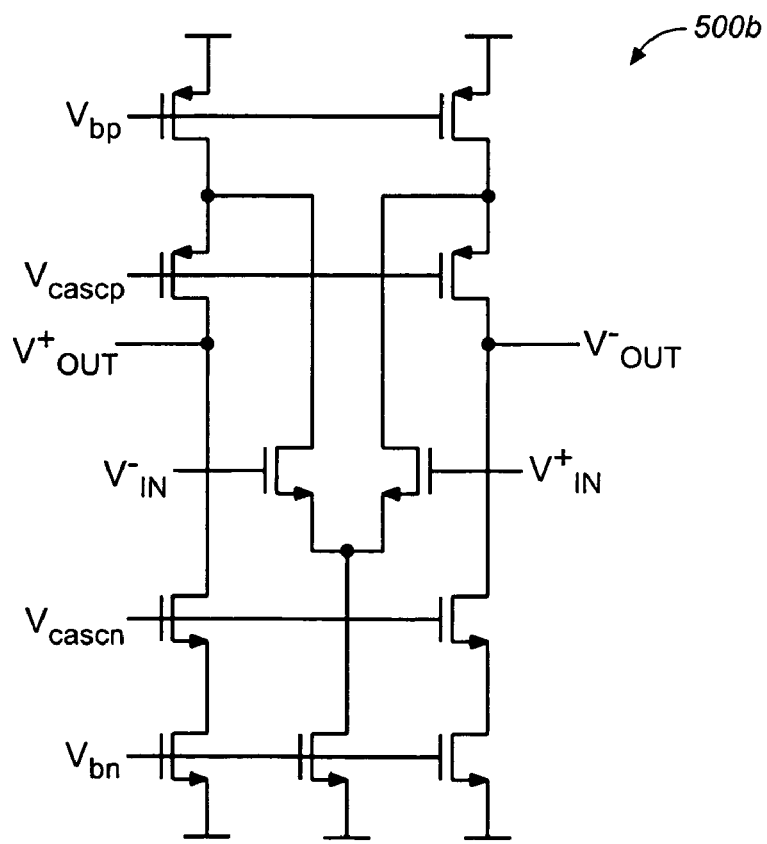
FIG. 5B shows a common-source amplifier followed by a common-gate amplifier.

A given amplifier stage of a multistage feedforward compensated operational amplifier 250a–c can be implemented in a number of ways. In one implementation, a differential common-source amplifier, similar to a differential common-source amplifier 500a shown in FIG. 5A, can be used. In another implementation, an amplifier stage of a multistage feedforward compensated operational amplifier 250 can include a cascoded configuration of a common-source amplifier followed by a common-gate amplifier similar to a cascoded configuration 500b shown in FIG. 5B. A cascoded configuration 500b can have a higher DC gain than the common-source amplifier configuration 500a.

Figure 5C:
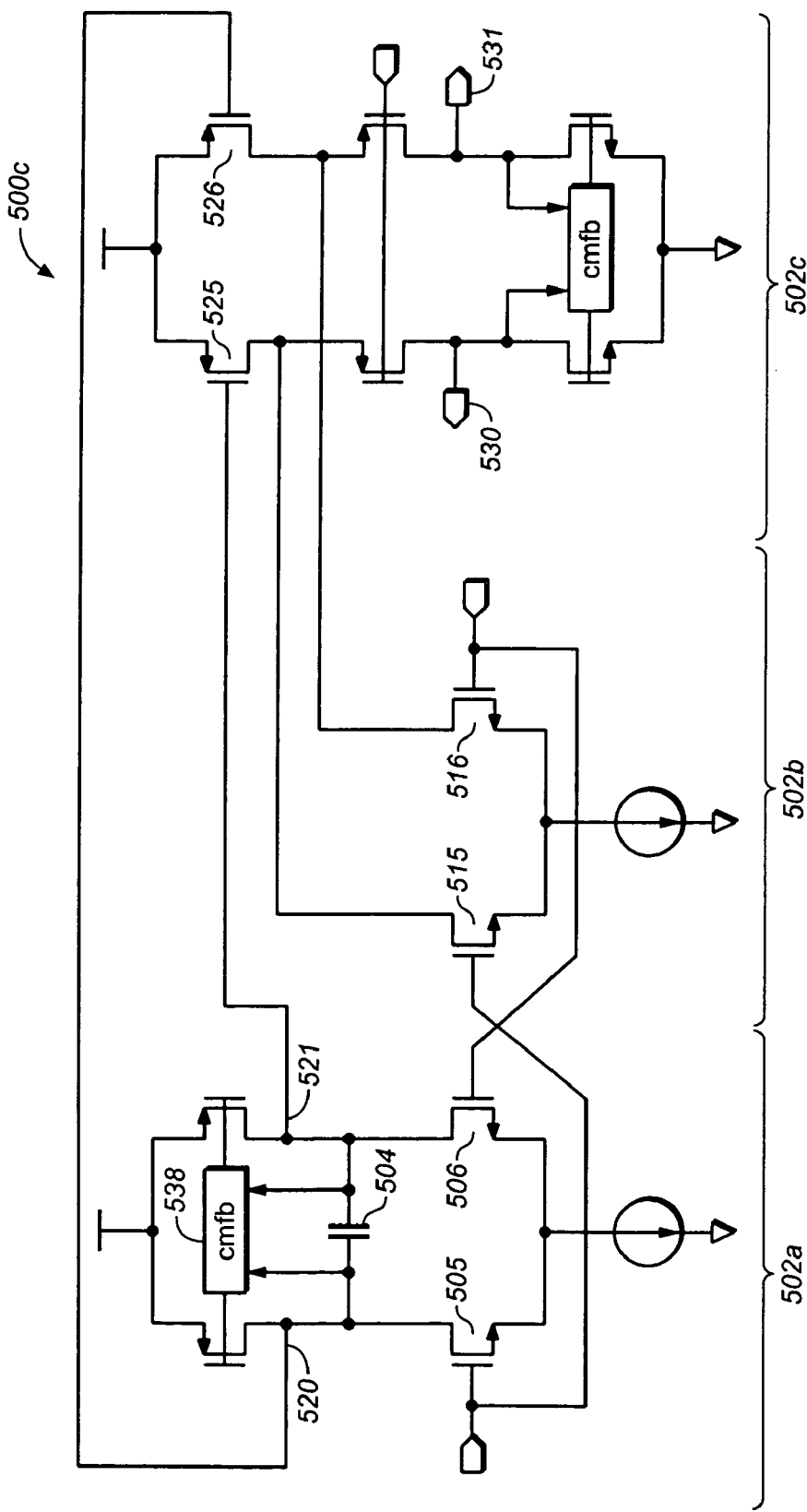
FIG. 5C shows an implementation of a multistage feedforward compensated operational amplifier with current recycling.

Referring to FIG. 5C, another implementation of an amplifier stage of a multistage feedforward compensated operational amplifier 250, referred to as "current-recycling" configuration 500c, can include two cascaded stages that use, or "recycle", a common current. The current-recycling configuration 500c can save power and reduce noise. The first cascaded stage 502a of the current-recycling configuration 500c can include two transistors 505, 506 configured as a common source amplifier. The first cascaded stage 502a of the current-recycling configuration 500c can further include a compensation capacitor 504 to adjust the path crossover frequency $f_c$. The first cascaded stage 502a of the current-recycling configuration 500c can further include a common mode feedback circuit 518 (labeled cmfb) that maintains a constant common mode voltage at nodes 520 and 521. The second cascaded stage 502c of the current-recycling configuration 500c can include two transistors 525, 526 configured as a common source amplifier. The current-recycling configuration 500c can further include a bypass stage 502b. The bypass stage 502b can include two transistors 515, 516 configured as a common source amplifier. The current used in the bypass stage 502b can be reused in the second cascaded stage 502c. The second cascaded stage 502c of the current-recycling configuration 500c can further include a common mode feedback (cmfb) circuit 538 that can maintain a constant common mode voltage at output nodes 530, 531.

Figure 6:
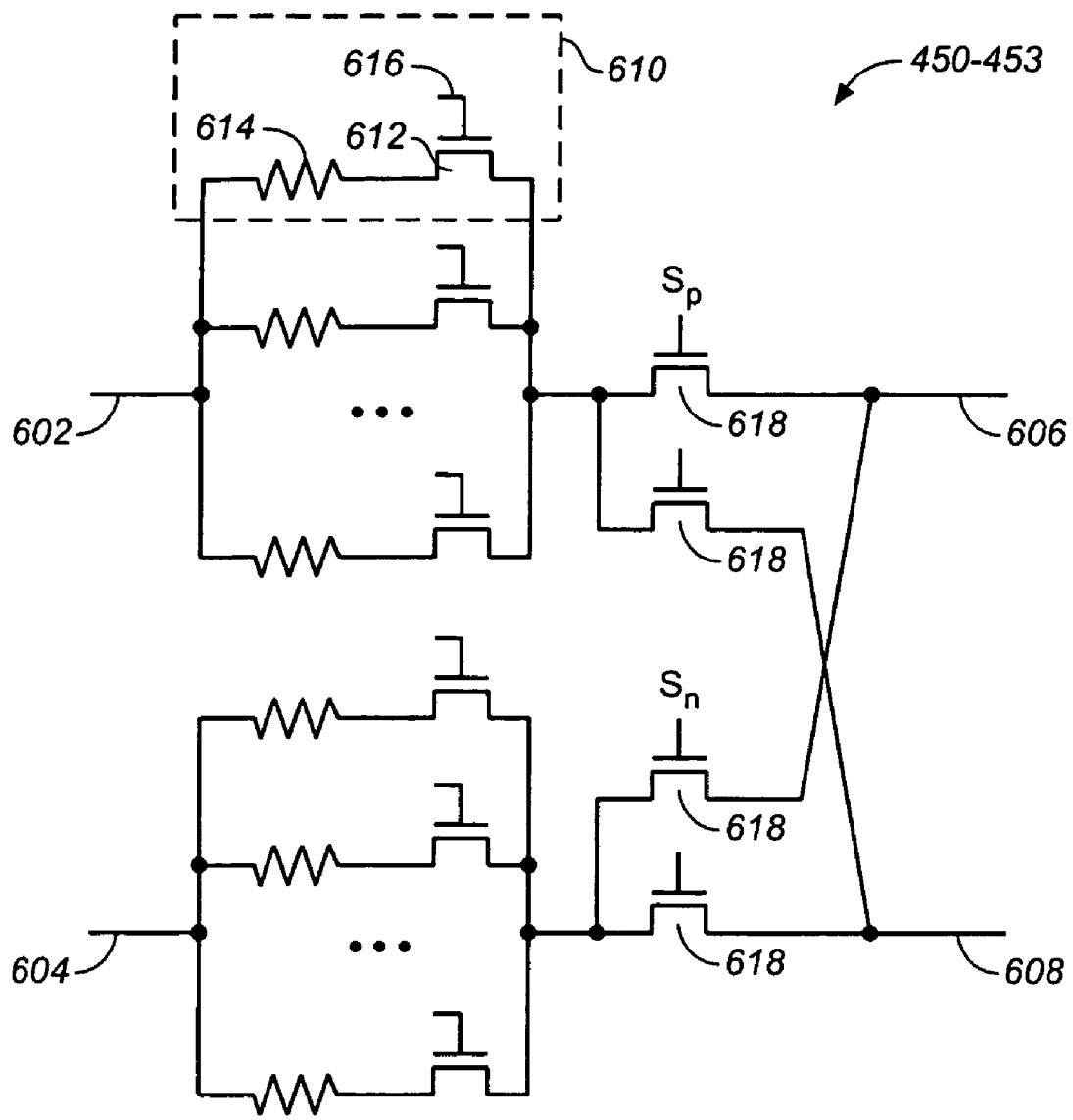
FIG. 6 shows an implementation of variable resistors.

Referring again to FIG. 4, the variable resistors 450–453 can be implemented in a variety of way. FIG. 6 shows one implementation of the variable resistors 450–453. Variable resistor inputs 602 and 604 can be connected to the cascaded amplifier stages 420a, 420b of the forward-path multistage feedforward compensated operational amplifiers 250a in FIG. 4. Variable resistor outputs 606 and 608 can be connected to the cascaded amplifier stages 432a, 432b of the multistage feedforward compensated operational amplifiers 250b of the loop filtering section 114 in FIG. 4.

A number of series transistor-resistor pairs 610 can be connected in parallel between the variable resistor inputs 602, 604 and the variable resistor outputs 606, 608. Each series transistor-resistor pair 610 can include a resistor 614 and a transistor 612. The transistors 612 in the series transistor-resistor pairs 610 can be used as switches to control the exact number of series transistor-resistor pairs 610 that are connected in parallel between the variable resistor inputs 602, 604 and the variable resistor outputs 606, 608. The transistors 612 can be controlled using thermometer-coded control bits 616.

A number of parallel sign-controlling transistors 618 can be connected in series with each string of series transistor-resistor pairs 610 to control the sign of the signal at the variable resistor outputs 606, 608. For example, if signal Sp is asserted (high), the current at the variable resistor outputs 606, 608 can be in positive proportion to the voltage applied at the variable resistor inputs 602, 604. If signal Sn is asserted (high), the current at the variable resistor outputs 606, 608 can be in negative proportion to the voltage applied at the variable resistor inputs 602, 604.

A number of embodiments of the invention have been described. Nevertheless, it will be understood that various modifications may be made without departing from the spirit and scope of the invention. For example, referring to FIG. 2, only a subset on the amplifiers used in the baseband section 102 of a Cartesian feedback loop 100 (e.g., only a forward-path amplifier 250a) can be implemented as multistage feedforward compensated operational amplifiers to reduce the phase shift in the Cartesian feedback loop 200. Accordingly, other embodiments are within the scope of the following claims.

What is claimed is:

1. A circuit comprising:
   a Cartesian feedback loop, the Cartesian feedback loop including one or more operational amplifiers, wherein at least one of the one or more operational amplifiers comprises
   two or more cascaded amplifier stages; and
   one or more bypass amplifier stages connected in parallel with the two or more cascaded amplifier stages.

2. The circuit of claim 1, wherein the two or more cascaded amplifier stages are configured such that a gain roll-off of the respective operational amplifier is above 20 decibels per decade for a range of frequencies.

3. The circuit of claim 2, wherein the range of frequencies includes a crossover frequency of the Cartesian feedback loop.

4. The circuit of claim 1, wherein the two or more cascaded amplifier stages comprises two cascaded amplifier stages.

5. The circuit of claim 1, wherein the one or more bypass amplifier stages comprises one bypass amplifier stage.

6. The circuit of claim 1, wherein the Cartesian feedback loop includes an I-loop, the I-loop carrying an in-phase signal, a Q-loop, the Q-loop carrying a quadrature signal, and a phase rotator, the phase rotator keeping the I-loop and the Q-loop uncoupled.

7. The circuit of claim 6, wherein the two or more cascaded amplifier stages and the one or more bypass amplifier stages are included in the phase rotator.

8. The circuit of claim 1, wherein at least one of the two or more cascaded amplifier stages or the one or more bypass amplifier stages comprises a common-source amplifier.

9. The circuit of claim 1, wherein at least one of the two or more cascaded amplifier stages or the one or more bypass amplifier stages comprises a common source amplifier followed by common-gate amplifier.

10. The circuit of claim 1, wherein the Cartesian feedback loop includes a forward-path amplifier in a forward path of the Cartesian feedback loop, the two or more cascaded amplifier stages and the one or more bypass amplifier stages being included in the forward-path amplifier.

11. The circuit of claim 1, wherein the Cartesian feedback loop includes a feedback amplifier in a feedback path of the Cartesian feedback loop, the two or more cascaded amplifier stages and the one or more bypass amplifier stages being included in the feedback amplifier.

12. The circuit of claim 1, wherein the Cartesian feedback loop includes a loop filter to filter a signal in a forward path of the Cartesian feedback loop, the two or more cascaded amplifier stages and the one or more bypass amplifier stages being included in the loop filter.

13. The circuit of claim 1, wherein a current in at least one of the two or more cascaded amplifier stages or the one or more bypass amplifier stages is recycled in at least another one of the two or more cascaded amplifier stages or the one or more bypass amplifier stages.

* * * * *